United States Patent [19]

Costello

[11] 3,717,743

[45] Feb. 20, 1973

[54] METHOD AND APPARATUS FOR HEAT-BONDING IN A LOCAL AREA USING COMBINED HEATING TECHNIQUES

[75] Inventor: Bernard J. Costello, Ringoes, N.J.

[73] Assignee: Argus Engineering Company, Inc., Hopewell, N.J.

[22] Filed: Dec. 7, 1970

[21] Appl. No.: 95,536

Related U.S. Application Data

[62] Division of Ser. No. 863,163, Oct. 2, 1969, abandoned.

[52] U.S. Cl. ....................219/85, 219/347, 219/349

[51] Int. Cl. ....................B23k 1/02

[58] Field of Search........219/85, 347, 349, 354, 404, 219/411

[56] References Cited

UNITED STATES PATENTS

| | | | |
|---|---|---|---|
| 3,617,682 | 11/1971 | Hall | 219/85 |
| 3,290,479 | 12/1966 | Avedissian | 219/85 |
| 3,486,004 | 12/1969 | Morrone | 219/347 X |
| 3,518,411 | 6/1970 | Rhode | 219/349 |
| 3,283,124 | 11/1966 | Kawecki | 219/85 X |

*Primary Examiner*—C. L. Albritton
*Assistant Examiner*—L. A. Schutzman
*Attorney*—Samuel Ostrolenk et al.

[57] ABSTRACT

Method for joining a dielectric or semi-conductive element to a metallic layer employing a combination of heating techniques. The substrate upon which the metallic layer is already deposited is heated to a "-background" temperature substantially below the temperature required for bonding, to reduce the local temperature rise required to perform the bond and to reduce the shock experienced by the substrate due to thermal gradients which occur during the bonding cycle. The bonding energy in the form of radiant energy, is focussed upon the side of the substrate opposite to the side on which the bond is to be formed, and in the region of said bond, and is at a level sufficient to heat the interface to a temperature greater than the bond point to enable the two materials to flow together and form the bond. Focussing the bonding energy upon the opposite surface of the substrate causes the bonding surface of the element to be hotter than the bulk of the element thus causing a thermal gradient across the element such that the top surface of the semi-conductor element is much cooler than the under surface, providing an enhanced margin of safety in preventing thermal damage to active zones or thermally sensitive regions in the element being bonded. The dielectric or semi-conductive element being bonded to the metal layer is often scrubbed across the metal layer to enhance formation of the bond by removing oxide coatings which may have formed on the element and which would otherwise reduce the effectiveness of the bond.

3 Claims, 2 Drawing Figures

METHOD AND APPARATUS FOR HEAT-BONDING IN A LOCAL AREA USING COMBINED HEATING TECHNIQUES

This application is a division of U.S. application Ser. No. 863,163, filed Oct. 2, 1969, now abandoned and substituted by streamline application Ser. No. 119,016, filed Feb. 25, 1971.

The present invention relates to the bonding of insulating or semi-conductive elements to a metal layer, and more particularly to a novel method for bonding dielectric or semi-conductive elements to a conductive layer through a combination of heating techniques to form an excellent alloy bond while preventing the damage or destruction of active regions in the bulk or on the surface of the dielectric or semi-conductive element opposite that being bonded.

There exists a number of applications, especially in the electronics manufacturing field, wherein it is desired to applique bond a small device to the surface of a larger structure. As one example, it may be desired to join a silicon die or wafer to a substrate of ceramic or metal through a conductive layer positioned therebetween. As another example, it may be desired to bond a ceramic chip capacitor to a metallic conductor provided on a glass or ceramic substrate. These two particular applications should be considered as being merely exemplary for purposes of understanding the problems in forming such bonds and techniques and apparatus of the present invention.

The bonding mechanism is almost always thermally activated, i.e., the interface between the members being joined must be heated to cause the formation of the bond.

Several conventional processes have been used to join materials of this general category. Some of these are: gold-silicon eutectic bonding, soldering, thermocompression bonding, and conductive adhesive bonding.

The methods currently employed in the industry for introducing energy to the interface between the elements being joined include almost all heating methods, namely: conduction heating, electrical resistance, hot gas, friction, and infrared heating, to name just a few. A variety of means have been employed to combine controls and fixtures in order to produce a desired effect in the workpiece.

The apparatus and method of the present invention which I have developed is primarily related to the formation of silicon die bonds to gold films, usually provided on ceramic substrates. The invention is characterized by heating the joint to a temperature greater than the eutectic point of the materials being joined (typically Si-Au) such that two materials flow together to form the bonding alloy. Temperature control is very critical in this type of operation due to the fact that the gold must be prevented from infiltrating the active semi-conducting zones of the silicon. Although the method and apparatus of the present invention is extremely advantageous for use in forming Si-Au eutectic bonds, many other types of metal-semi-conductive and metal-insulating elements may be joined through the use of the present method and apparatus.

During the formation of the bond it is desirable to maintain the insulating or semi-conductive die at as low a temperature as possible. It is further desirable to perform the operation in as short a time interval as is possible, not only for purposes of controlling the production economics, but also for the purpose of preventing overheating of other heat sensitive elements in or near the bonding area. For this reason a very desirable feature of the present method and apparatus is the ability to locally heat the area immediately in the vicinity of the bond so as to prevent overheating of other elements in the area such as, for example, previously bonded silicon dies or resistor elements deposited thereon.

The present invention is characterized by the utilization of a combination of heating techniques. The metal layer and/or substrate containing the metal layer is initially heated to a temperature somewhat lower than the eutectic point, which temperature level is higher than typical room temperature to thereby reduce the temperature rise required in the locality of the bond and which is necessary to form a suitable bond. This "-background" ambient level further reduces the shock experienced by the substrate due to thermal gradients produced during the bonding cycle. The "background" temperature is preferably in the range of 25° to 100° C. lower than the eutectic point so as to be incapable of damaging previously formed bonds or causing metallic migration in dies already bonded.

The background heating may be accomplished by several methods. Two effective methods, among others, which may be used are infrared radiation and a heated platen.

The bonding energy of the present invention is provided through the use of infrared heating techniques. The infrared radiation is delivered to the interface to be formed by directing the radiation to the sub-surface of substrate to which the dielectric or semi-conductive wafer is being bonded. The local substrate area subtending the bond area is heated by conduction through the substrate or, in the case of a semi-transparent substrate, by combined conduction and radiation. The metallic conductive surface to which the bond is to be made is thus heated and the element to be bonded is in turn heated by conduction from the hot metallic surface. By this direction of heating, the thermal gradient is negative upon progression into the bulk of the element. This thermal gradient is sufficient to insure that the temperature level at the opposite surface of the element is sufficiently below that critical temperature level at which metallic migration or damage of the element occurs. Further, the local area is heated at such a fast rate that the lateral dissapation of energy in the substrate by conduction also produces a negative thermal gradient, thus protecting surrounding areas which may have thermally sensitive areas such as previously bonded dies or resistive elements. The insulating or semi-conductive wafer being bonded to the metallic layer is preferably positioned by means of a holding chuck and is oscillated or "scrubbed" back and forth (i.e., in a reciprocating manner) thus removing by abrasion any oxide coatings which may be present on the surfaces being bonded, and further to suitably initiate the wetting of material.

It is therefore one object of the present invention to provide a novel method and apparatus for bonding insulating and/or semi-conductive wafers to a metallic layer by raising the region encompassing the elements being bonded to a "background" temperature level below the eutectic point and directing radiant energy in a highly localized manner to the immediate region of the bond and in a manner so as to cause heating, by conduction, of the wafer to prevent thermal damage of highly heat-sensitive bonds or other elements positioned on the surface opposing the bonding region.

Still another object of the present invention is to provide a novel method and apparatus for bonding insulating or semi-conductive wafers to a metallic layer to form a ceramic-metallic or semi-conductive-metallic alloy therebetween wherein the region generally encompassing the components being joined is raised to a background temperature below the eutectic point and wherein infrared radiation focussed upon a highly localized area in the immediate vicinity of the bond raises the bonding region above eutectic to provide an alloy bond whereby the positioning and focussing of the bonding energy prevents the active zones and/or previously formed bonds on the wafer and on the substrate from experiencing thermal damage or reflow.

These as well as other objects of the present invention will become apparent when reading the accompanying description and drawings in which.

Figures 1, 2:
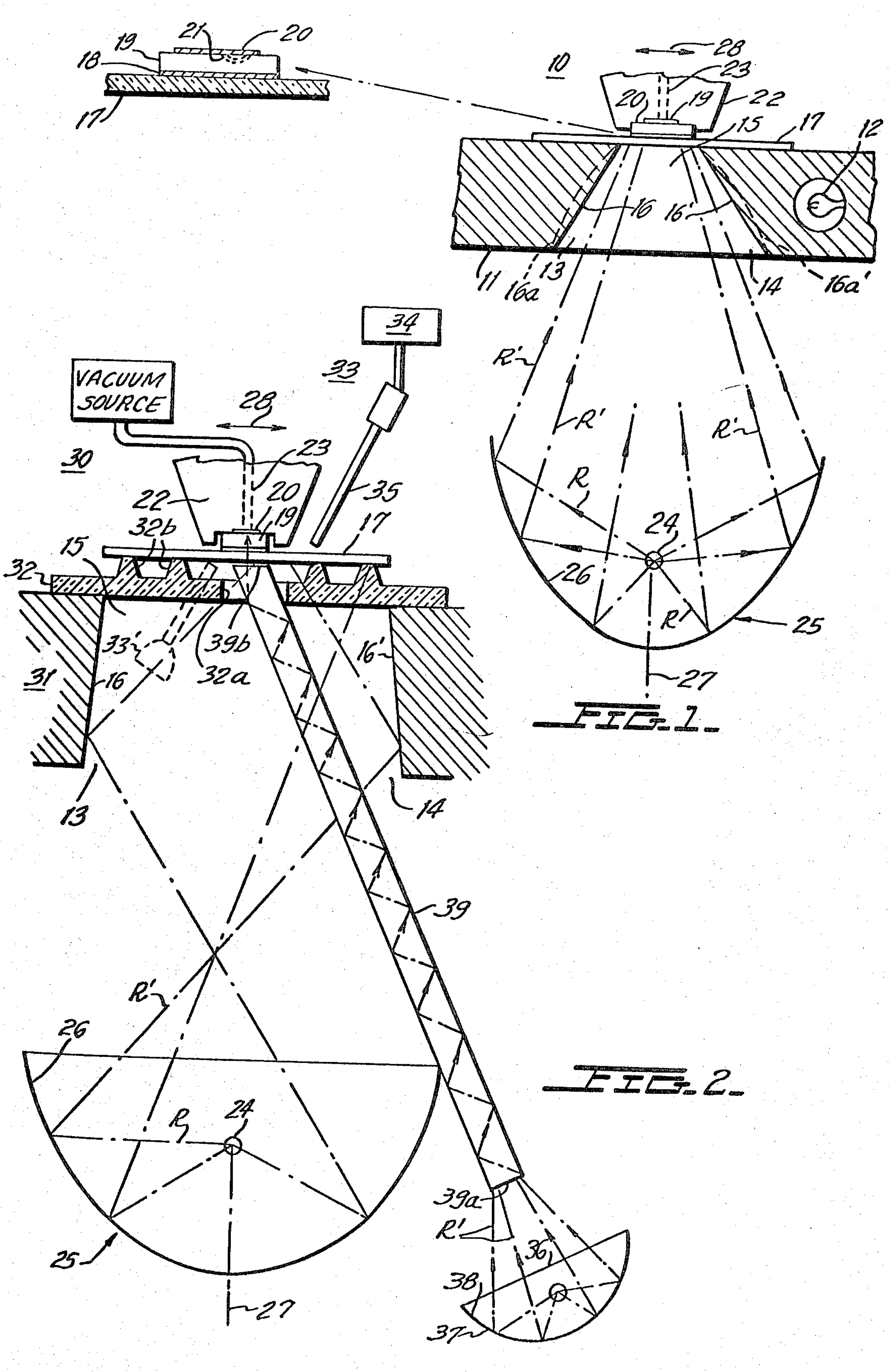
FIG. 1 shows an elevational view of a heating apparatus embodying the principles of the present invention.
FIG. 2 shows an elevational view of an alternative embodiment of the present invention.

The apparatus 10 of FIG. 1 is comprised of a metallic plate 11 having a heat source 12 imbedded therein or otherwise connected thereto so as to raise the metallic plate to the desired "background" temperature level. The heat source may be a heating coil, a high wattage lamp, or any other device suitable for raising the temperature of the supporting plate 11 to the prescribed level.

The plate 11 is provided with an aperture 13 extending through the entire plate to provide inlet and outlet openings 14 and 15, respectively. The opening 13 is preferably provided with inclined walls 16 which are highly polished and highly reflective for the purpose of reflecting infrared radiation impinging thereon. The configuration of the opening may be of a truncated conical shape or alternatively the reflective surfaces of the opening may be planar and arranged in inclined fashion as shown in the Figures. For example, the opening may be comprised of four inclined surfaces forming a truncated pyramid shape as shown by the surfaces 16–16′. The number of flat inclined surfaces may also be greater or lesser in number than three. As another alternative, the surfaces need not be planar but may be provided with a slight curvature as shown by the dotted lines 16*a*–16*a*′. The preferred configuration at least being such that the inlet opening 14 is greater than the outlet opening 15. For example, in the case where the reflective surface of the opening is a truncated conical configuration, the diameter of the inlet opening 14 is preferably greater than the diameter of the outlet opening 15.

The top surface of the heated supporting plate 11 supports a substrate 17 which may, for example, be a glass or ceramic substrate having one or a plurality of conductive metallic coatings deposited thereon. For example, the substrate 17 and its coatings may comprise a printed wiring board in which the conductive coatings act to electrically connect a plurality of discrete components and/or integrated circuits deposited thereon or otherwise affixed thereto. As shown in FIG. 1, substrate 17 has coated or otherwise deposited thereon a thin metallic layer 18 which is to be bonded to a wafer or die 19.

The wafer or die 19 may, for example, be a silicon die which is to be bonded to the ceramic substrate. Alternatively, the wafer may be a ceramic chip capacitor which is to be bonded to the printed circuit such that the metallic layer 18 forms one terminal of the capacitor. The metallic layer 18 may, for example, be gold which has been deposited upon the silicon or upon the substrate or alternatively, may be in the form of a loose gold foil positioned between the substrate 17 and the wafer 19. The thin metallic layer may alternatively have been previously bonded to the glass or ceramic substrate or may have been deposited (but not alloy bonded) upon the ceramic or semi-conductive wafer as a preform preparatory to the bonding operation.

The upper surface of wafer 19 may be provided with a coating 20 which may be a metallic coating previously bonded to wafer 19 or which may be comprised of active regions for components formed on the upper surface as discrete components or as an integrated circuit. As a further example, in the case of a silicon wafer, regions immediately adjacent the top surface may be doped with an N-type or a P-type dopant as represented by the dotted regions 21 for the purpose of forming one or more active elements (i.e., diodes, transistors, etc.) immediately adjacent the top surface of wafer 19.

It should be understood that the relative thicknesses of the elements 17–21, shown in FIG. 1, have been exaggerated for purposes of facilitating an understanding of the invention and not for the purpose of accurately depicting the actual size or thicknesses of these components.

The die 20 may be accurately positioned upon substrate 17 by means of a holding chuck 22 which may preferably be provided with a vertically aligned (or other suitably aligned) opening 23 for connection to a vacuum source to communicate the vacuum through opening 23 to the top surface of die 19 to facilitate pickup, transport and accurate positioning of the die upon substrate 17.

The apparatus 10 of FIG. 1 is further comprised of an infrared energy source 24 and a reflector 25 whose concave surface 26 is highly reflective to infrared rays so as to reflect rays originating from energy source 24 in a predetermined manner. As one example, the energy source 24 may be a source of infrared energy such as a high wattage filament lamp. The contour of reflective concave surface 26 is selected so as to reflect infrared rays R emitted from energy source 24 and focus these reflected rays R′ in the immediate region of the elements being bonded. As one example, the contour of the reflective surface 26 may be elliptical. The energy source 24 is positioned substantially coincident with the primary focal point of the ellipse so as to produce an image substantially of the dimensions of the energy source in the immediate region of the interface between the metallic layer 18 and the ceramic or semi-conductive wafer 19.

The diagonally aligned reflective surfaces of opening 13 operates as a kaleidoscopic cavity acting to cause rays impinging upon its reflective facets, either directly from the energy source or reflected from reflector 25 to undergo one or a multiple number of internal reflections repetitively from one opposing facet to another until a portion of these rays are ultimately passed through the outlet end 15 of the opening. Those rays (either reflected or direct) which enter into the kaleidoscopic cavity at an angle relative to the imaginary vertical axis 27 are reflected or bounced between the opposing reflective facets either one or more times until a portion of the rays are ultimately emitted from the outlet opening 15. A portion of those rays entering cavity 13 will be passed directly through aperture 15 where they perform their heating function. The kaleidoscopic cavity acts upon the distribution of infrared rays so that the intensity of the rays passing out of the outlet opening 15 are distributed across the opening in a very uniform manner resulting in uniform heating of the entire region immediately adjacent the outlet opening. The geometry of opening 15 further serves to limit the irradiated area only to that region immediately adjacent the configuration of the outlet opening. Thus, the region extending beyond the outlet opening is masked and is not subjected to any infrared radiation and therefore is not subjected to any undue heating which is otherwise required to provide the bonding energy and which might therefore damage or destroy adjacent heat sensitive circuitry.

The bonding process performed by the apparatus of FIG. 1 functions in the following manner:

The substrate 17, the metallic layer 18 and wafer 19 are accurately positioned immediately above the outlet opening 15 of the supporting plate 11. Die 19 is preferably lifted, transported and accurately positioned by means of holding chuck 22.

The energy source 12 has raised supporting plate 11 and hence the components 17–21 of the materials being bonded to the background temperature. The temperature level of the "background" temperature is selected so as to be incapable of damaging previously made bonds which were similar in nature to that being formed and/or to prevent metallic migration in dies already bonded and/or to prevent damage to heat sensitive components deposited or otherwise formed near the top surface of the die 19. The "background" temperature nevertheless is of a sufficient level to reduce the shock experienced by the wafer 19 and the substrate 17 due to thermal gradients present during the bonding cycle.

The infrared energy source 24 and reflector 25 are positioned such that the secondary focus of reflected rays R′ is located approximately coincident with the exit opening 15. The energization of energy source 24 localizes the bonding energy so as to be coincident with the region immediately adjacent exit aperture 15. Energy source 24 is energized after the "background" temperature level is achieved. The energy source is selected so as to generate energy in a substantially uniform manner across the exit opening sufficient to heat the bonding region to a temperature level greater than the bonding point of the materials being bonded so that the materials flow together to form the bonding alloy. The temperature control is very critical in this type of operation because the metal must be prevented from infiltrating the insulating or semi-conductive wafer and thereby reaching its active zones. Bonding energy is selected so as to raise the materials being bonded to a temperature preferably to a level which exceeds the bonding temperature by as much as 15°C. In one typical example, the metal layer may, for example, be gold (Au) and the wafer may, for example, be silicon (Si) and the bonding energy preferably is in the range from 385°–400° C. sufficient to form an Si-Au bonding alloy between the elements.

The holding chuck 22 is oscillated or "scrubbed" back and forth in a reciprocating manner to provide relative motion between the silicon and gold during the time in which the energy source 24 is energized. This "-scrubbing" action serves to remove any oxidation that may be present on the surface of the silicon and further facilitates wetting of the silicon surface by the metallic layer.

The infrared energy that performs the final heating phase to attach the die 19 to substrate 17 through the medium of the metallic layer 18 can clearly be seen to be directed to the bottom surface of substrate 17. In this manner, the bonding energy is absorbed in the substrate and conducted to the die. In some cases, some of the energy is transmitted if the substrate is not opaque and is thereby absorbed in the metalized surface. However, the major amount of heat present in the die 19 is conveyed to the die by conduction resulting in the development of a thermal gradient across the thickness of the die 19 (measured in the direction of vertical axis 27) such that the die is at a much lower temperature near its top surface where the active regions are located as compared with the temperature in the region of the interface between metallic layer 18 and the bottom surface of wafer 19. A direct result of this technique is the enhanced margin of safety in preventing thermal damage to the active zones while at the same time providing sufficient bonding energy. In addition thereto, the speed of the bonding operation and absolute freedom from heater borne contamination (as a result of non contact heating) provides a technique which is far superior to conventional methods. By precisely controlling and limiting the zone of heating, the die bonding operation does not disturb neighboring components.

FIG. 2 shows an alternative embodiment in which like components as between FIGS. 1 and 2 are designated with like numerals.

The apparatus 30 of FIG. 2 is comprised of a supporting member 31 (which may or may not be formed of a metallic material) and having an opening 13 whose surfaces 16–16′ (as shown in cross-section form a highly reflective kaleidoscopic cavity for the reflection of infrared energy entering through the inlet port 14 and exiting through outlet port 15. In the case where the supporting structure 31 is formed of a metallic material the surfaces 16–16′ may be highly polished. In the case where the supporting structure is formed of any other material, the surfaces defining the kaleidoscopic cavity or opening 13 may be a reflective material deposited over the exposed surface of the opening.

A reflector 25 and infrared energy source 24 are positioned such that the secondary focus of reflected rays is approximately coincident with entrance aperture 14. Any rays not directly parallel to vertical axis 27 (i.e. offset at an angle to axis 27) are reflected one or more times by the kaleidoscopic cavity so as to develop a "background" temperature level which is substantially uniform over the region defined by the exit aperture 15.

A quartz plate 32 having projections or raised portions 32*b* along its top surface, preferably in the form of a waffle-iron-type pattern, is supported above the exit opening 15. The substrate 17 is positioned upon the projections 32*b* which maintain substrate 17 above the main body of the quartz plate to prevent the quartz from absorbing excessive energy from the substrate due to the minimal surface contact between substrate 17 and plate 32. The outlet opening 15 of the kaleidoscopic cavity has dimensions sufficient to cover the entire substrate or a large portion thereof.

The die 19 is lifted, transported and accurately positioned upon substrate 17 by means of chuck 22 which may be provided with an opening 23 communicating with a suitable vacuum source for holding the die to the bottom face of the chuck at least during the time in which the die is lifted and transported to the bonding position.

The infrared radiation source 24 is energized so as to cause both direct rays from source 24 and rays reflected from concave surface 26 of reflector 25 to be focussed generally in the region of the entrance aperture. Those infrared rays striking the facets of the kaleidoscopic cavity are reflected one or more times as they pass from the inlet to the exit aperture such that the region immediately adjacent the exit aperture is heated in a substantially uniform manner. The "-background" temperature may be monitored by a suitable infrared detector 33 having a control circuit 34. The probe 35 of the detector is coupled to the control circuit 34 which, in turn, is electrically coupled to radiation source 24 to reduce the power level supplied to radiation source when the background temperature is reached.

Once the "background" temperature level in the region of substrate 17 is reached, a second energy source 36, which may be of the same type as energy source 24, is energized, preferably by control circuit 34 which may simultaneously reduce the power level to energy source 24 when the "background" temperature is reached and energize infrared energy source 36 at that time. A reflector 37 which may generally be of the same type as reflector 25 and which is provided with a concave reflective surface 38, cooperates with infrared source 36 to focus reflected rays R' upon the "input" end 39*a* of a quartz rod 39 which is a light transmissive cylindrical shape rod, whose cylindrical surface is highly polished. Infrared rays focussed upon the "input" surface is caused to experience a number of internal reflections over the length of the rod (due to the highly polished cylindrical surface) causing radiation emitted from the "output" end 39*b* to be distributed in a substantially uniform manner over the bonding region located immediately adjacent the "output" end. The radiation is further substantially confined to strike a region of basically the same configuration as the "output" end to prevent any undue heating of the regions surrounding the elements being heated. In this respect, it should be obvious that the quartz rod need not be cylindrical and may have a cross-sectional configuration of any other suitable shape such as triangular, square, rectangular, oval, octagonal, or any other polygonal shape.

The quartz supporting plate is preferably provided with an opening 32*a* of dimensions sufficient to permit quartz rod 39 to pass therethrough and be positioned so that its "output" end lies immediately adjacent the underside of substrate 17 in the region of die 19. The energy level of source 36 is sufficient to raise the interface between die 19 and conductive layer 18 to the bonding temperature. The die 19 is "scrubbed" across the metallic layer in a reciprocating manner as shown by arrows 28, to remove any oxidation which may be on the contacting surfaces and to facilitate wetting in the same manner as was previously described.

In the embodiment of FIG. 2, it should again be noted that die 19 is heated as a result of the thermal energy absorbed by the substrate 17 which is conducted to the die to assure that the thermal gradient across the thickness of the die 19 will be such that the temperature at the top surface (where the active regions are located) is significantly lower than the temperature in the bonding region to prevent thermal damage to the active zones. Also, the zone of heating is precisely controlled by the size and configuration of the quartz rod "output" end so that the bonding energy will not disturb adjacent components. The "background" temperature acts to reduce the thermal shock experienced by the substrate due to the thermal gradients present during the bonding operation.

If desired, the heated platen 11 may be substituted for the energy source 24 and 25 employed in FIG. 2.

It can be seen from the foregoing description that the method and apparatus of the present invention provides a technique for bonding an insulating or semiconductive wafer to a metallic layer to form a bond in which the combination of heating apparatus employed in the method provides sufficient bonding energy at the interface between the wafer-metallic components while at the same time assuring a safe margin of thermal energy in the region of the opposite surface of the wafer to prevent thermal damage to the active zones provided in/or upon the opposite surface. The technique described herein may be performed rapidly (usually in the order of 2 to 5 seconds) and is absolutely free from contamination. Highly localized bonding energy precisely controls the zone of heating as well as preventing thermal damage to adjacent components.

The above advantages become especially pronounced from a comparison of present techniques, some of which are as follows:

Substrate is heated to a temperature higher than eutectic and the die is scrubbed in place. The disadvantages of this technique are such that the entire substrate is subjected to excessive heat and that successive die attachments are not possible since a reflowing of previous joints will occur due to the fact that the entire substrate is at a temperature level higher than eutectic. In addition thereto, the thermal inertia in the substrate causes the die to see a high temperature longer than is necessary to form the alloy bond.

Heating the substrate to the background temperature and heating the die to the medium of the chuck to the bonding temperature results in overheating of the die since the heat flow is through the silicon or ceramic element toward the interface between the elements being bonded resulting in the active area of the die being subjected to the highest temperature level.

Although there has been described a preferred embodiment of this novel invention, many variations and modifications will now be apparent to those skilled in the art. Therefore, this invention is to be limited, not by the specific disclosure herein, but only by the appending claims.

I claim:

1. A method for bonding a thin metallic layer provided on a radiant energy transmissive insulating substrate to one surface of a non-metallic wafer comprising the steps of:

a. positioning said non-metallic wafer upon the bonding surface of said layer;

b. raising the temperature of the region surrounding the members being bonded to a level insufficient to cause alloy bonding of said wafer and said layer;

c. directing radiant energy upon the interface between the metallic layer and the insulating substrate from a remote radiant energy source positioned to one side of said metallic layer opposite said wafer whereby said substrate transmits the radiant energy therethrough to the said interface;

d. limiting the directed radiant energy substantially to the area occupied by the bonding region;

e. maintaining the radiant energy at a level sufficient to raise the temperature of the bonding region between said layer and said wafer to at least the eutectic point whereby the heat is conducted to said wafer by said metallic layer to heat the surface of the wafer engaging the metallic layer to the bonding temperature and thereby form an alloy with said metallic layer while said substrate is maintained at a temperature level lower than the temperature at said interface.

2. A method for bonding a non-metallic wafer to a thin flat conductive terminal provided upon a radiant energy transmissive insulating substrate comprising the steps of:

a. placing one surface of said wafer in contact with the exposed surface of said metallic layer;

b. raising the temperature of the region surrounding the members being bonded to a level insufficient to cause alloy bonding of said wafer and said layer;

c. directing radiant energy upon the metallic layer from a remotely located infra red radiant energy source positioned to one side of said metallic layer opposite said wafer to transmit said radiant energy through said substrate for heating the interface between said terminal and said substrate;

d. limiting the directed radiant energy substantially to the area occupied by the bonding region between the wafer and the terminal;

e. maintaining the radiant energy at a level sufficient to raise the temperature of the bonding region to at least the eutectic point whereby the heat is conducted to said wafer by said metallic layer to heat the surface of the wafer engaging the metallic layer to the bonding temperature to thereby form an alloy with said metallic layer while said substrate is maintained at a temperature level lower than the temperature level at said interface.

3. The method of claim 1 further comprising the step of scrubbing said wafer upon said layer in a reciprocating manner to remove any oxidation therebetween.

* * * * *